(12) United States Patent
Hong et al.

(10) Patent No.: US 11,239,336 B2
(45) Date of Patent: Feb. 1, 2022

(54) INTEGRATED CIRCUIT STRUCTURE WITH NIOBIUM-BASED SILICIDE LAYER AND METHODS TO FORM SAME

(71) Applicant: GLOBALFOUNDRIES U.S. Inc., Santa Clara, CA (US)

(72) Inventors: Wei Hong, Clifton Park, NY (US); Yanping Shen, Saratoga Springs, NY (US); Domingo A. Ferrer, Clifton Park, NY (US); Hong Yu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/788,922

(22) Filed: Feb. 12, 2020

(65) Prior Publication Data
US 2021/0249518 A1  Aug. 12, 2021

(51) Int. Cl.
| | |
|---|---|
| H01L 29/45 | (2006.01) |
| H01L 29/417 | (2006.01) |
| H01L 29/66 | (2006.01) |
| H01L 29/08 | (2006.01) |
| H01L 27/088 | (2006.01) |
| H01L 29/165 | (2006.01) |
| H01L 29/78 | (2006.01) |
| H01L 21/285 | (2006.01) |

(52) U.S. Cl.
CPC ........ *H01L 29/45* (2013.01); *H01L 21/28518* (2013.01); *H01L 27/088* (2013.01); *H01L 29/0847* (2013.01); *H01L 29/165* (2013.01); *H01L 29/41758* (2013.01); *H01L 29/41766* (2013.01); *H01L 29/665* (2013.01); *H01L 29/66636* (2013.01); *H01L 29/78* (2013.01); *H01L 29/6653* (2013.01); *H01L 29/6656* (2013.01)

(58) Field of Classification Search
CPC ........ H01L 21/32051; H01L 21/32053; H01L 21/02425; H01L 21/28518; H01L 21/823814; H01L 29/78618; H01L 29/66507; H01L 29/45; H01L 29/458; H01L 21/823418; H01L 21/823425; H01L 21/823815; H01L 21/823475; H01L 21/823871; H01L 29/665; H01L 21/768–76898; H01L 29/41766; H01L 29/41758; H01L 29/0847; H01L 27/088; H01L 29/78
See application file for complete search history.

(56) References Cited

U.S. PATENT DOCUMENTS

| | | | |
|---|---|---|---|
| 9,805,973 | B2 | 10/2017 | Adusumilli et al. |
| 2011/0147855 | A1 | 6/2011 | Joshi et al. |

(Continued)

*Primary Examiner* — Sonya McCall-Shepard
(74) *Attorney, Agent, or Firm* — Hoffman Warnick LLC

(57) ABSTRACT

Embodiments of the disclosure provide an integrated circuit (IC) structure with a niobium-based silicide layer. An IC structure according to the disclosure includes a transistor on a substrate, the transistor including a gate structure above the substrate and a source/drain (S/D) region on the substrate adjacent the gate structure. A niobium-based silicide layer is on at least an upper surface the S/D region of the transistor, and extends across substantially an entire width of the S/D region. An S/D contact to the S/D region is in contact with the niobium-based silicide layer.

12 Claims, 10 Drawing Sheets

(56) References Cited

U.S. PATENT DOCUMENTS

| | | | |
|---|---|---|---|
| 2014/0306290 A1 | 10/2014 | Alptekin et al. | |
| 2014/0306291 A1 | 10/2014 | Alptekin et al. | |
| 2015/0171178 A1* | 6/2015 | Breil | H01L 21/823814 |
| | | | 438/682 |
| 2017/0301536 A1* | 10/2017 | Yen | H01L 21/02532 |
| 2018/0005903 A1 | 1/2018 | Basker et al. | |
| 2019/0148230 A1* | 5/2019 | Tsai | H01L 21/76895 |
| | | | 257/190 |

* cited by examiner

US 11,239,336 B2

INTEGRATED CIRCUIT STRUCTURE WITH NIOBIUM-BASED SILICIDE LAYER AND METHODS TO FORM SAME

TECHNICAL FIELD

Embodiments of the disclosure relate generally to integrated circuits (ICs). More specifically, the disclosure relates to IC structures with a niobium-based silicide layer and methods to form the same.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, bipolar junction transistors (BJTs), FETs, and capacitors. Circuit chips with hundreds of millions of such devices are common.

Circuit fabricators are currently seeking to reduce the two-dimensional area occupied by device components, e.g., to reduce two dimensional area and power consumption. As circuit components continue to shrink, greater numbers of devices may be formed in close proximity. As device density continues to increase, forming materials to ensure reliable operation of transistors has proven to be a technical challenge. In some cases, materials chosen to improve the performance of some transistor types will negatively affect the performance of other transistor types. In certain cases, the polarity of a transistor may dictate whether a particular material improves or degrades transistor operation. Varying the materials in a transistor based on polarity may increase the number of masks and/or intermediate steps needed to form an IC structure.

SUMMARY

Aspects of the disclosure provide an integrated circuit (IC) structure, including: a transistor on a substrate, the transistor including a gate structure above the substrate and a source/drain (S/D) region on the substrate adjacent the gate structure; a niobium-based silicide layer on at least an upper surface the S/D region of the transistor, wherein the niobium-based silicide layer extends across substantially an entire width of the S/D region; and an S/D contact to the S/D region and in contact with the niobium-based silicide layer.

Further aspects of the disclosure provide an integrated circuit (IC) structure, including: a first transistor on a substrate, the first transistor including a first gate structure above the substrate and a first source/drain (S/D) region on the substrate adjacent the first gate structure; a niobium-based silicide layer on at least an upper surface the first S/D region of the first transistor, wherein the niobium-based silicide layer extends across substantially an entire width of the first S/D region; an isolation layer on the substrate adjacent the first transistor; an second transistor on the substrate adjacent the isolation layer, the second transistor including a second gate structure above the substrate and a second source/drain (S/D) region on the substrate adjacent the second gate structure, wherein the isolation layer is between the first transistor and the second transistor, and wherein the second S/D region is free of niobium-based silicide material thereon; and a first S/D contact to the first S/D region in contact with the niobium-based silicide layer; and a second S/D contact to the second S/D region in contact with the second S/D region.

Another aspect of the disclosure provides a method of forming an integrated circuit (IC) structure, the method including: forming a gate structure on a silicon-based substrate; forming a source/drain (S/D) region on the silicon-based substrate adjacent the gate structure; forming a niobium-based layer on at least the S/D region of the structure, such that the niobium-based layer covers substantially an entire horizontal width of the S/D region; converting the niobium-based layer into a niobium-based silicide layer on the S/D region, wherein the niobium-based silicide layer extends across substantially an entire width of the S/D region; and forming a S/D contact to the S/D region in contact with the niobium-based silicide layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
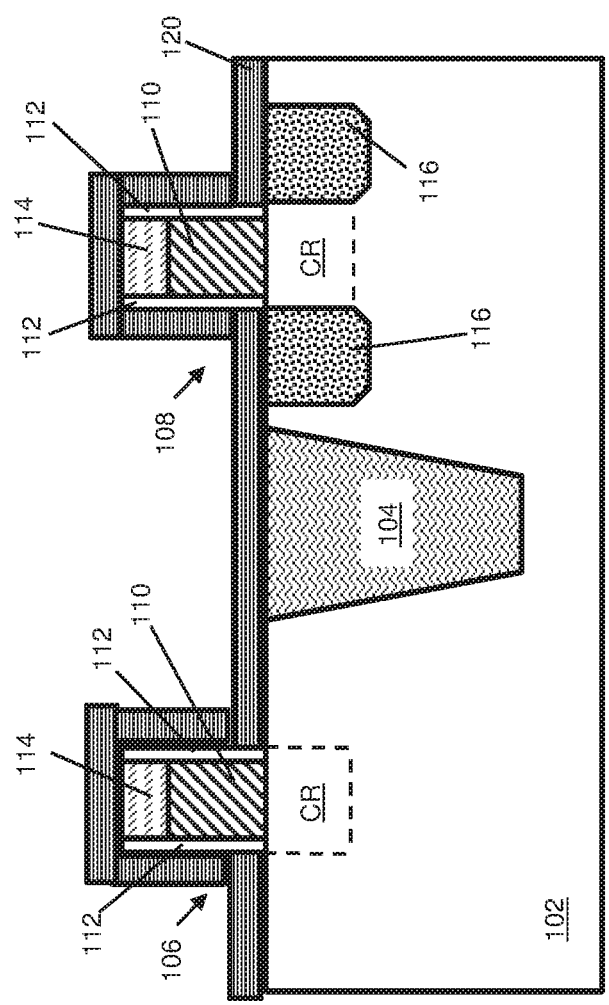
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure with a niobium-based silicide layer on source and/or drain regions, and methods to form the same. Embodiments of the disclosure include a transistor on a substrate, the transistor including a gate structure above the substrate and a source/drain (S/D) region on the substrate adjacent the gate structure. A niobium-based silicide layer is on at least an upper surface the S/D region of the transistor, and extends across substantially an entire width of the S/D region. An S/D contact to the S/D region is in contact with the niobium-based silicide layer. In contrast with conventional device configurations, embodiments of the disclosure allow silicide material to be formed on an entire upper surface of the S/D region, such that silicide material extends horizontally outward from sidewalls of the S/D contact. Conventional processes to form silicide material, by contrast, limit silicide formation to the contact area between S/D material and a contact thereon, and/or may include materials that are not niobium-based. In further embodiments, one transistor of a first doping type may include the niobium-based silicide layer while other transistors of a second doping type may be free of niobium-based silicide layers.

Referring to FIG. 1, embodiments of the disclosure provide methods to form an IC structure. FIG. 1 illustrates an initial structure 100 (simply "structure" hereafter) capable of being processed to form an IC structure according to embodiments of the disclosure. Structure 100 may be formed on a silicon-based substrate (simply "substrate" hereafter) 102 including, e.g., silicon and/or silicon in conjunction with one or more semiconductor materials. Various additional semiconductor materials suitable for inclusion within substrate 102 may include silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained. Although substrate 102 is shown for the sake of example as being a bulk layer, substrate 102 alternatively may take the form of a semiconductor on insulator (SOI) substrate, a semiconductor fin extending vertically above an insulator layer, and/or any other currently known or later developed type of substrate structure.

One or more isolation layers 104 may be formed within substrate 102, e.g., to physically and electrically separate two horizontally adjacent transistor structures from each other. Isolation layer(s) 104 may be formed, e.g., by vertically recessing substrate 102 at selected locations to form an opening, and forming the opening with one or more insulative materials. Isolation layer 104 may be composed of one or more oxide compounds, and/or any other currently known or later-developed electrically insulative substances. Isolation layer 104 may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

The forming of structure 100 may include forming a first gate structure 106 and a second gate structure 108 on substrate 102. According to an example, gate structure(s) 106, 108 may be positioned such that one or more isolation layers 104 are positioned horizontally between the portions of substrate 102 where each gate structure 106, 108 is formed. Although embodiments of structure 100 may include only first gate structure 106, multiple gate structures 106, 108 are discussed to illustrate various structural and method features according to the disclosure. Gate structure(s) 106, 108 may be formed, e.g., by forming a polycrystalline silicon (simply "polysilicon" hereafter) layer 110 and/or other materials over selected locations of substrate 102, e.g., by deposition. Deposition or "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Polysilicon layer 110 of gate structure(s) 106, 108 may not be electrically conductive at the time of its initial deposition, and may be doped with conductive ions and/or replaced with conductive metals in subsequent processing.

Each gate structure 106, 108 may include various materials to protect the composition of polysilicon layer 110 from being inadvertently modified, removed, etc., during subsequent processing of structure 100. For instance, each gate structure 106, 108 may include a set of spacers 112, which may be formed on sidewalls of polysilicon layer 110. Spacer(s) 112 may be provided as one or more bodies of insulating material formed above substrate 102 and on sidewalls of polysilicon layer(s) 110, e.g., by deposition/etching, thermal growth, etc. Spacer(s) 112 may be formed to electrically and physically separate gate structure(s) 106, 108 from other components, e.g., various inter-level dielectric materials formed in subsequent processing. Spacer(s) 112 may include one or more low-K dielectric materials, i.e., dielectric materials with a dielectric constant of at most approximately 3.9. Spacer(s) 112, for example, may include one or more insulative oxide and/or nitride materials. In some cases, spacer(s) 112 may include one or more insulative materials included in isolation layer 104 or a different insulative material.

Embodiments of the disclosure may also include forming a gate cap 114 on polysilicon layer(s) 110, e.g., by selective deposition. Gate cap 114 may protect underlying portions of polysilicon layer 110 from being etched, modified, etc., and may have one or more of the same insulative materials included within isolation layer 104 and/or spacer(s) 112.

Gate cap 114 may include, e.g., one or more nitride insulators and/or any other currently known or later developed insulative material. Gate cap 114 may include one or more of the various insulative materials described elsewhere herein, and/or may have a different composition of insulative materials. A pair of source/drain (S/D) regions 116 may be formed within substrate 102 adjacent second gate structure 108, e.g., by implanting or otherwise introducing conductive ions into portions of substrate 102 where source and drain terminals of a transistor are desired.

According to an embodiment, S/D regions 116 may include silicon germanium (SiGe) and/or any other type of semiconductor material, along with any dopants selected for a particular transistor type and/or polarity. In a more specific example, S/D regions 116 may include SiGe with one or more P-type doping materials. A non-doped portion of substrate 102 horizontally between two S/D regions 116, 116 and/or vertically below gate structure(s) 106, 108 may form a channel region CR of the eventual transistor structures. S/D regions 116 may be distinguished from channel region CR and other portions of substrate 102 by having a greater concentration of dopants than channel region CR as discussed herein, and/or may otherwise be distinguished based on the materials subsequently formed thereon.

Embodiments of the disclosure may include forming an additional spacer 120 on S/D regions 116 and exposed surfaces of second gate structure 108. Additional spacer 120 may be formed, e.g., by conformally depositing one or more masking materials on gate structure(s) 106, 108 and S/D region(s) 116 selected for protection during subsequent processing. The composition of additional spacer 120 may be the same as, or similar to, spacer(s) 112, or in some cases may include one or more photoresist materials. Portions of additional spacer 120 subsequently may be removed, e.g., over first gate structure 106, to allow first gate structure 106 and its corresponding portion of substrate 102 to include features that are different from second gate structure 108 and/or other portions of insulator 102.

Figure 2:
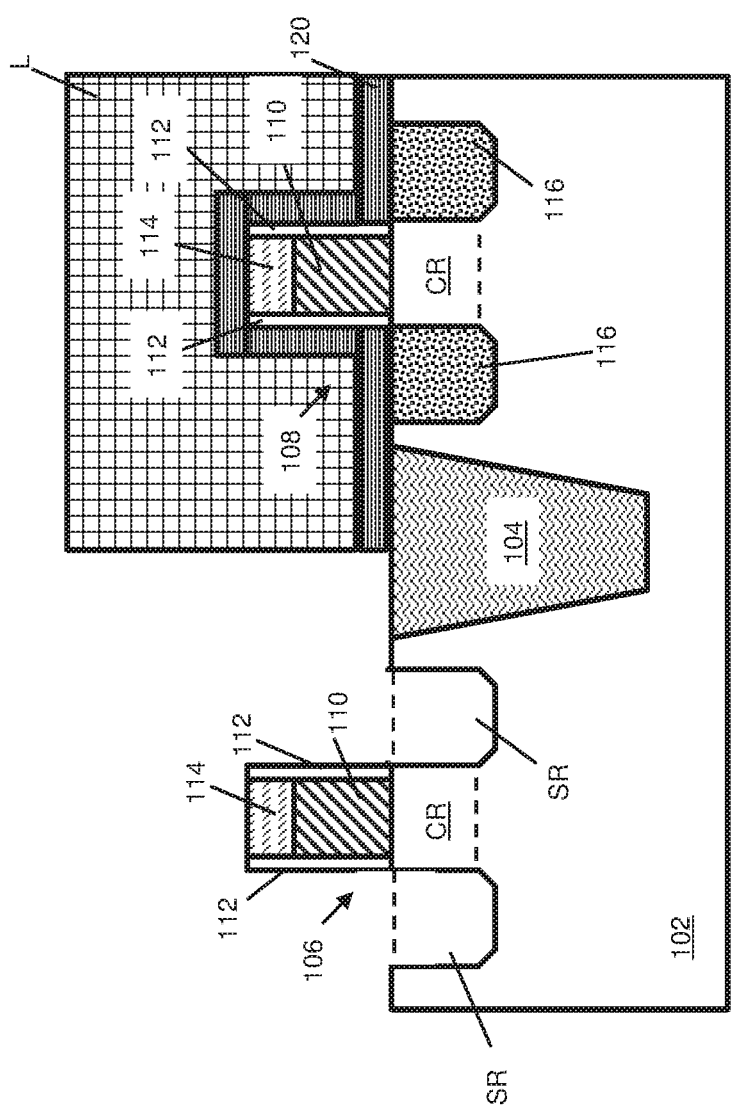
FIG. 2 provides a cross-sectional view of forming source and drain openings adjacent a selected gate structure according to embodiments of the disclosure.

Referring to FIG. 2, first gate structure 106 and its adjacent portions of substrate 102 may be targeted for selected processing by forming a preliminary mask L over second gate structure 108, in addition to adjacent portions of substrate 102 and/or isolation layer 104. Portions of additional spacer not covered by preliminary mask L may be susceptible to directional etching and/or other subsequent processes to form a transistor according to embodiments of the disclosure. First gate structure 106 may not yet include adjacent S/D materials such as those within S/D regions 116, e.g., to allow different materials to formed alongside first gate structure 106. Preliminary mask L may include a photoresist layer and/or any other currently known or later developed etch resistant material capable of protecting underlying portions of second gate structure 108, S/D regions 116, etc., from being etched.

Figure 3:
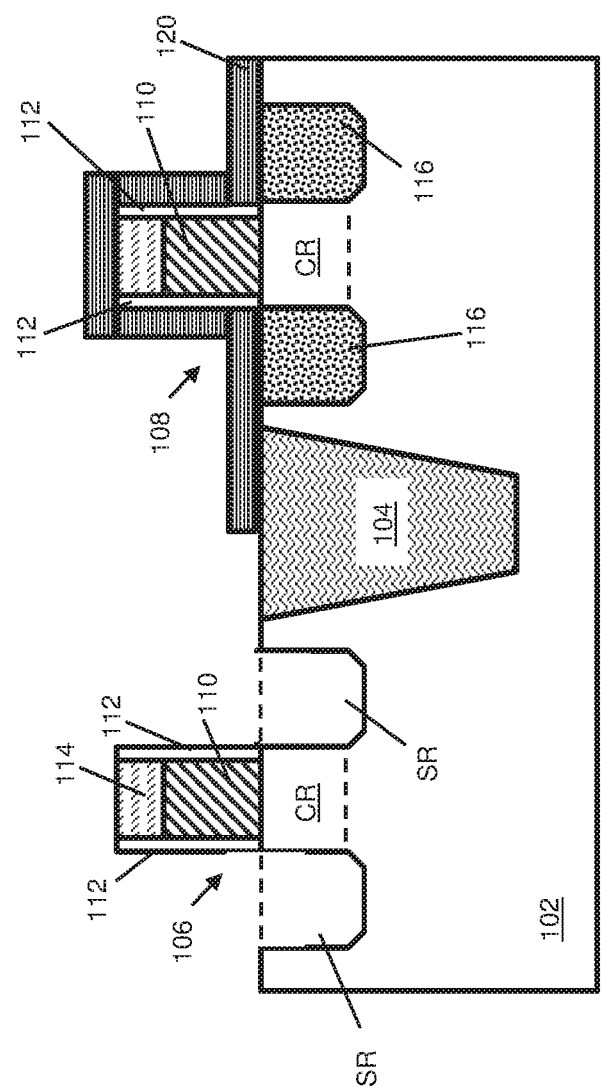
FIG. 3 provides a cross-sectional view of removing a preliminary mask after forming the source and drain openings according to embodiments of the disclosure.

Referring to FIGS. 2 and 3 together, methods according to the disclosure may include selective processing of first gate structure 106 without affecting second gate structure 108. With preliminary mask L in place, embodiments of the disclosure may include selective removing of additional spacer 120 at locations not covered by preliminary mask L. The selective removing of additional spacer 120 may be implemented, e.g., by stripping, selective etch, and/or other processes for selectively removing the material composition of additional spacer 120. Continued processing according to the disclosure may include etching and/or otherwise partially recessing substrate 102 adjacent first gate structure 102 at locations adjacent to first gate structure 106. Spacer(s) 112 and/or insulative cap 114 may be formed of an etch-resistant material (e.g., one or more oxide or nitride insulators) such that first gate structure 106 is unaffected during the etching of substrate 102. The etching of substrate 102 may form a set of S/D openings SR on opposite horizontal sides of channel region CR, and adjacent first gate structure 106. After the forming of S/D openings SR concludes, preliminary mask L may be removed (e.g., by stripping) as shown specifically in FIG. 3.

Figure 4:
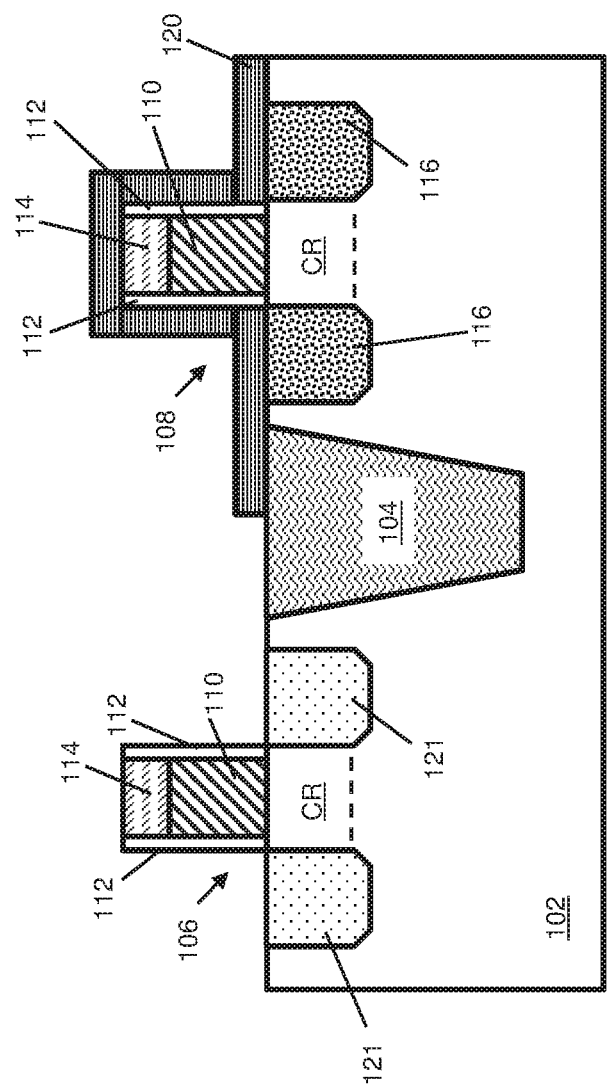
FIG. 4 provides a cross-sectional view of epitaxially growing a set of source and drain regions according to embodiments of the disclosure.

Referring now to FIG. 4, further processing according to the disclosure may include forming source and drain materials for first gate structure 106. Specifically, doped conductive materials may be formed within S/D openings SR (FIGS. 2, 3) adjacent first gate structure 106, e.g., by epitaxial growth. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

The materials used to form S/D regions 121 may include, e.g., silicon phosphide (SiP) and/or any other currently known or later developed material operable to form the source or drain of a transistor. Thus, S/D regions 121 adjacent first gate structure 106 may be distinguishable from S/D regions 116 each other based on their material composition. Such materials may be chosen based on their ability to accommodate dopants of a particular type and/or to allow selected forms of silicide material to be formed thereon. S/D regions 116, 121 may be at least partially embedded within substrate 102, and in various alternative implementations may have an upper surface that is raised above an upper surface of substrate 102 (e.g., as a result of epitaxial growth).

As discussed elsewhere herein, S/D regions 116, 121 may become electrically conductive through the use of dopants, e.g., conductive ions introduced to S/D regions 116, 121 by any currently known or later developed method. S/D regions 116, 121 in some cases may be doped by way of ion implantations. Doping is the process of introducing impurities (dopants) into the semiconductor substrate, or elements formed on the semiconductor substrate, and is often performed with a mask (or previously-formed, elements in place) so that only certain areas of the substrate will be doped. A "dopant" refers to an element introduced into a semiconductor to establish either P-type (acceptors) or N-type (donors) conductivity. Dopants are of two types: "donors" and "acceptors." N type implants are donors and P type are acceptors. In the case of a silicon substrate, common dopants may include, e.g., boron (B), and/or indium (In), for P-type doping. For N-type doping, the doped element(s) may include, for example, phosphorous (P) arsenic (As), and/or antimony (Sb). P-type and N-type doping types may themselves may be further characterized by their doping intensity relative to a baseline doping concentration for the material. P-type doped materials with an elevated number of "holes," i.e., charge carriers having a positive charge, are classified as being P+ doped. P-type doped materials carrying a greatly diminished number of electrons are classified as being P– doped. N-type doped materials with an elevated number of electrons are classified as being N+ doped. N-type doped materials carrying a greatly diminished number of holes are classified as being N– doped. According to an example, S/D regions 121 may have a first doping type (e.g., P-type doping) and S/D regions 116 may have a second doping type (e.g., N-type doping) opposite the first doping type.

Figure 5:
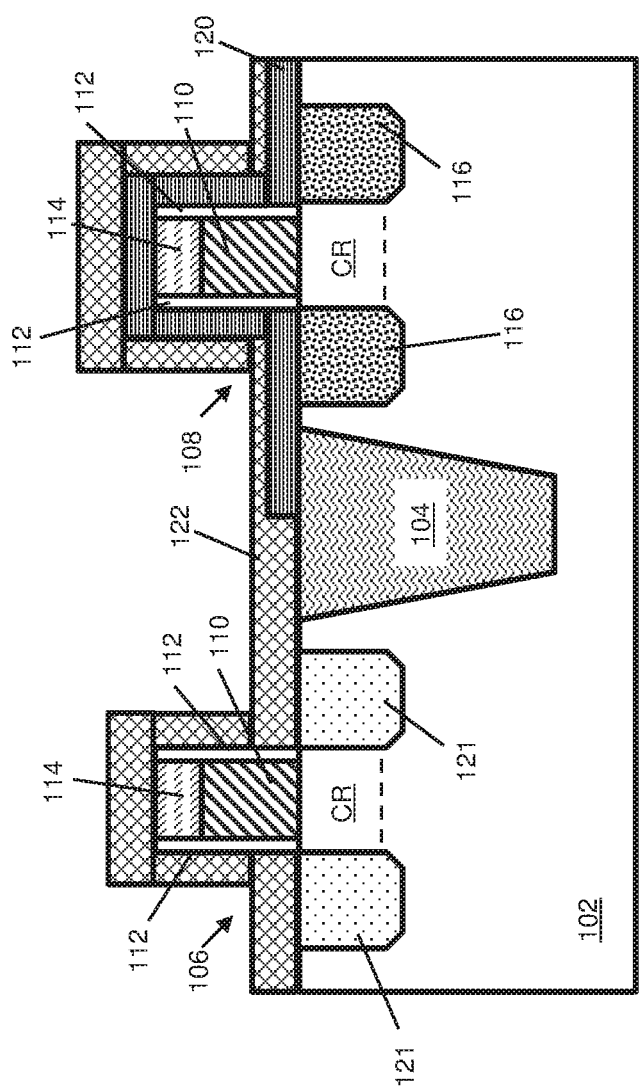
FIG. 5 provides a cross-sectional view of forming a niobium-based layer on the initial structure according to embodiments of the disclosure.

Turning to FIG. 5, embodiments of the disclosure may include forming precursor materials to form one or more silicide layers. It is emphasized that such materials may be formed before the deposition and etching of overlying materials (e.g., inter-level dielectric materials), and/or other processes for determining the location, size, etc., of contacts to source and/or drain materials. Embodiments of the disclosure may include forming a niobium-based layer 122 on at least S/D region(s) 121. According to an example, niobium-based layer 122 may be conformally and non-selectively deposited onto exposed materials, such that niobium-based layer 122 completely covers S/D regions 121 in addition to isolation layer 104, first gate structure 106, additional spacer 120, etc. Niobium-based layer 122 may take the form of any niobium (Nb)-based material, including one or more of various compounds and/or mixtures capable of being formed on S/D regions 121. In one example, niobium-based layer 122 may include a layer of titanium niobide (TiNb) formed on S/D regions 121 to a desired thickness. In other implementations, niobium-based layer 122 may include unreacted Nb together with titanium nitride (TiN). In this particular case, the material may have a mass concentration of Nb of at least approximately five percent total mass, or between five percent and seven percent total mass. However embodied, niobium-based layer 122 may be in direct physical contact with S/D regions 121 upon being deposited, while also being physically separated from S/D regions 116 by one or more previously-formed materials (e.g., additional spacer 120).

Figure 6:
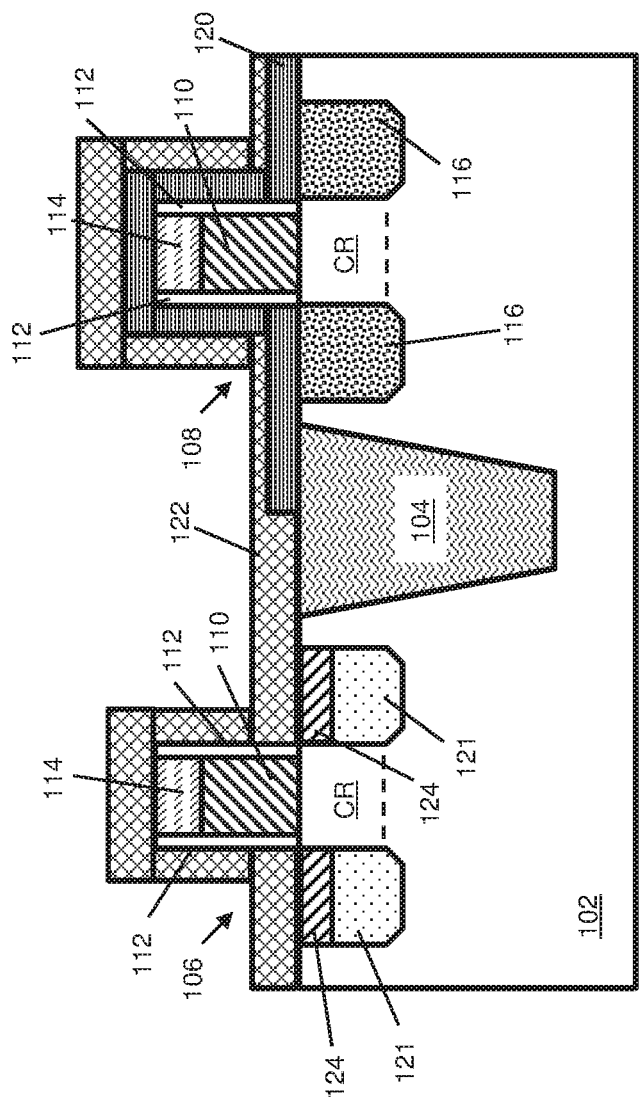
FIG. 6 provides a cross-sectional view of forming a niobium-based silicide layer from the niobium-based layer according to embodiments of the disclosure.

Turning now to FIG. 6, embodiments of the disclosure may include using niobium-based layer 122 to form one or more silicide materials on S/D regions 121. The use of niobium-based layer 122 to form silicide materials before subsequent deposition and etching of overlying materials on gate structure(s) 106, 108 is a contrast to the conventional processing of an IC structure. According to embodiments, the previously-formed niobium-based layer 122 may be heat treated to form a niobium-based silicide layer 124 on S/D regions 121. Niobium-based silicide layer 124 may be formed, e.g., by annealing to have the Nb metal of niobium-based layer 122 react with underlying silicon in S/D regions 121. The deposited niobium-based layer 122 will selectively react with underlying silicon, but will not react with non-silicon materials (e.g., those on exterior surfaces of first gate structure 106 and/or additional spacer 120). After niobium-based silicide layer 124 is formed, the resulting silicide material may extend across an entire top surface, and horizontal width of S/D region 121. Forming niobium-based silicide layer 124 in this configuration, among other things, may reduce the chances of misalignment between niobium-based silicide layer 124 and contacts subsequently formed thereto. In cases where additional spacer 120 and/or other materials are formed on second gate structure 108, the annealing of niobium-based layer 122 may have no effect on second gate structure 108. More specifically, niobium-based silicide layer(s) 124 may not be formed on S/D regions 116 in cases where niobium-based layer 122 is separated from S/D region(s) 116 by additional spacer 120 and/or other materials.

Figure 7:
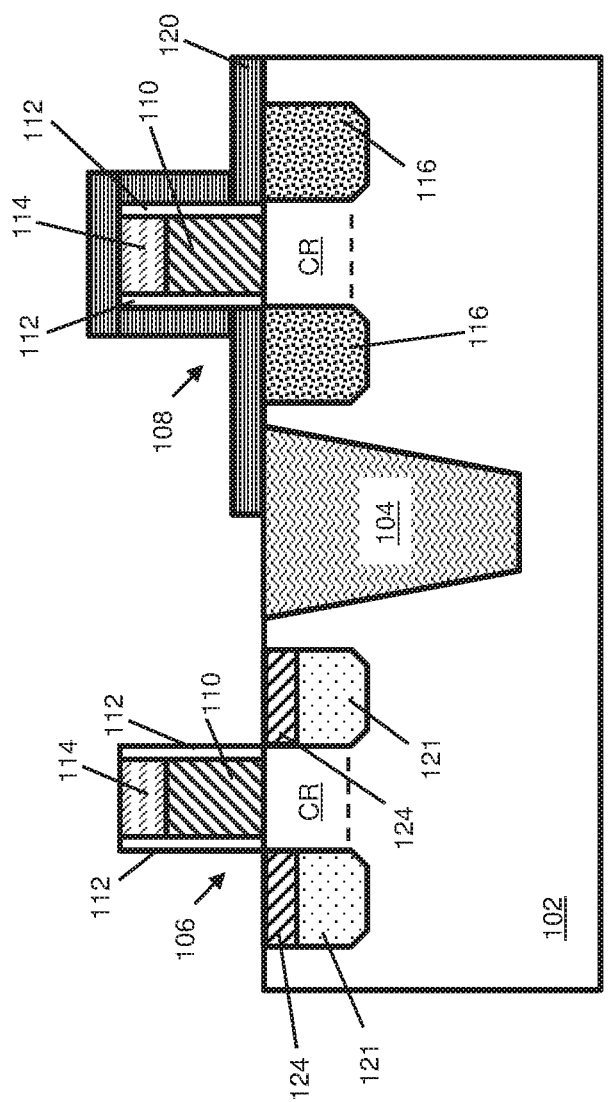
FIG. 7 provides a cross-sectional view of removing a remaining portion of the niobium-based layer according to embodiments of the disclosure.

Proceeding to FIG. 7, continued processing may include removing unreacted Nb materials before forming other portions of a transistor on gate structure(s) 106, 108 and/or S/D region(s) 116, 121. Specifically, remaining portions of niobium-based layer 122 that have not reacted with S/D region(s) 121 to form niobium-based silicide layer(s) 124 may be removed, e.g., by selective etching. The materials used for selective etching of niobium-based layer 122 may be selective to titanium (e.g., hydrofluoric acid) and/or other materials included within niobium-based layer 122, thus not affecting niobium-based silicide layer(s) 124. Additionally, the selective removing of niobium-based layer 122 may have substantially no effect on gate structure(s) 106, 108, and/or any materials covered by additional spacer 120. Once niobium-based layer 122 is removed, niobium-based silicide layer(s) 124 may be exposed and may cover an entire upper surface of S/D region(s) 121 as discussed elsewhere herein. In some alternative implementations, at least a portion of niobium-based layer 122 may not be removed.

Figure 8:
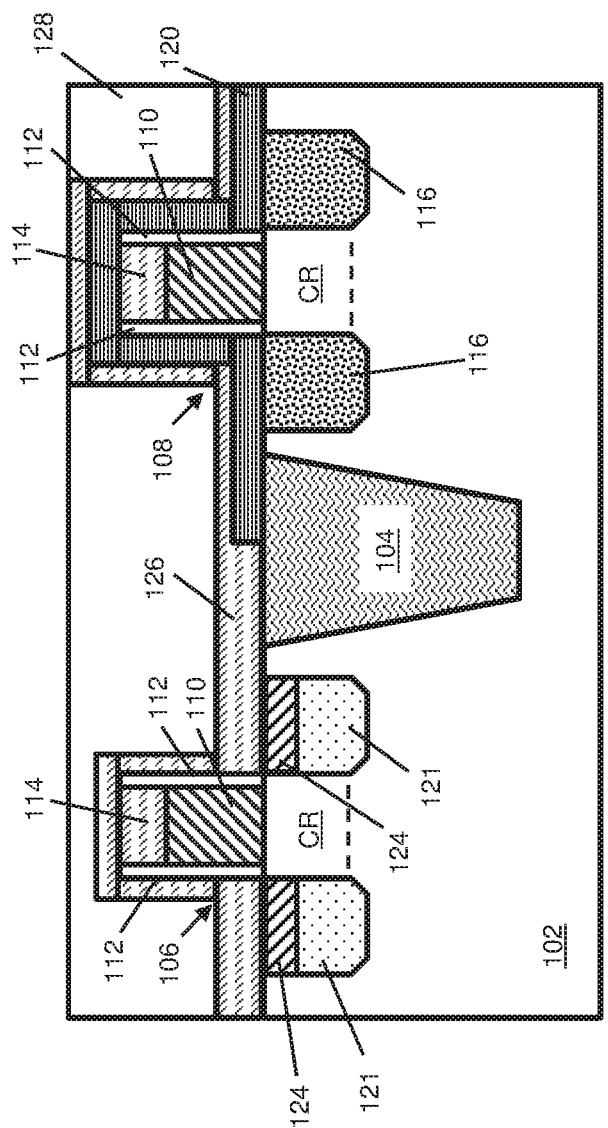
FIG. 8 provides a cross-sectional view of forming an insulative liner on an upper surface of the niobium-based silicide layer according to embodiments of the disclosure.

Turning now to FIG. 8, embodiments of the disclosure may include forming overlying portions of a transistor structure to complete the middle of line (MOL) fabrication stages of a device. For example, embodiments of the disclosure may include forming an insulative liner 126, also known in the art as a "contact etch stop layer" or simply "CESL" on exposed surfaces of gate structure(s) 106, 108, S/D region(s) 116, 121, as well as any exposed surfaces of substrate 102 and isolation layer 104. Insulative liner 126 may include, e.g., a nitride insulator and/or other currently known or later developed insulative substances configured to operate as an etch stop layer during manufacture of a device. An "etch stop layer" refers to any material featuring drastically different etch characteristics than overlying material to be etched (e.g., oxide insulators) and is typically underneath such materials to stop an etching process. Insulative liner 126 upon being formed, may be in contact with the previously-formed niobium-based silicide layer(s) 124 over S/D regions 121. Continued processing may also include, e.g., forming an inter-layer dielectric (ILD) 128 over the previously-formed materials to a desired height. ILD 128 may include one or more insulators described herein with respect to isolation layer 104, and/or may include any other currently known or later developed insulative material.

Figure 9:
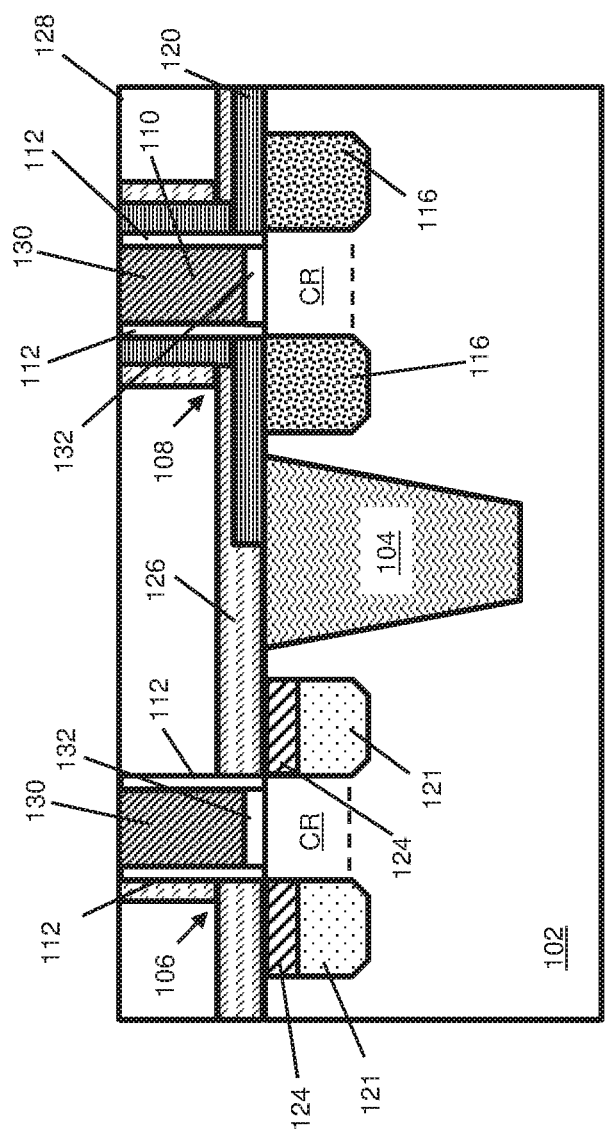
FIG. 9 provides a cross-sectional view of forming a gate metal over the substrate according to embodiments of the disclosure.

Referring to FIG. 9, continued processing may include replacing various precursor materials within gate structure(s) 106, 108 with other materials selected to operate as portions of a transistor gate terminal. For example, ILD 128 may be recessed (e.g., vertically etched, planarized by chemical mechanical planarization etc.) to approximately the upper surface of gate structure(s) 106, 108. In some implementations, polysilicon layer(s) 110 (FIGS. 1-6) simply may be doped with P-type or N-type dopants to form a conductive gate terminal without undergoing additional modifications. In the illustrated example, polysilicon layer(s) 110 may be replaced with conductive gate materials. This process may be known as "replacement metal gate (RMG) processing," and the materials formed by such a process may be known as a "replacement metal gate structure" (RMG) 130. Metal gate replacement is a process in which sacrificial and replaceable dummy gates, e.g., polysilicon layer(s) 110, are used as a placeholder for metal gate structures during processing that would damage the metal gates, such as the forming of niobium-based silicide layer(s) 124.

Each RMG 130 may be formed on a gate dielectric 132 formed of an insulative material, e.g., one or more dielectric materials having a dielectric constant of at least approximately 3.9. Materials suitable for use as gate dielectric 132 may include but are not limited to: hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. According to an embodiment, gate dielectric 132 may be formed by being deposited onto channel region CR of substrate 102, and RMG 130 may subsequently be deposited on gate dielectric 132. RMG 130 may also be formed horizontally between spacers 112. Other portions of each gate structure 106, 108 may remain substantially intact after RMG 130 and gate dielectric 132 are formed.

Figure 10:
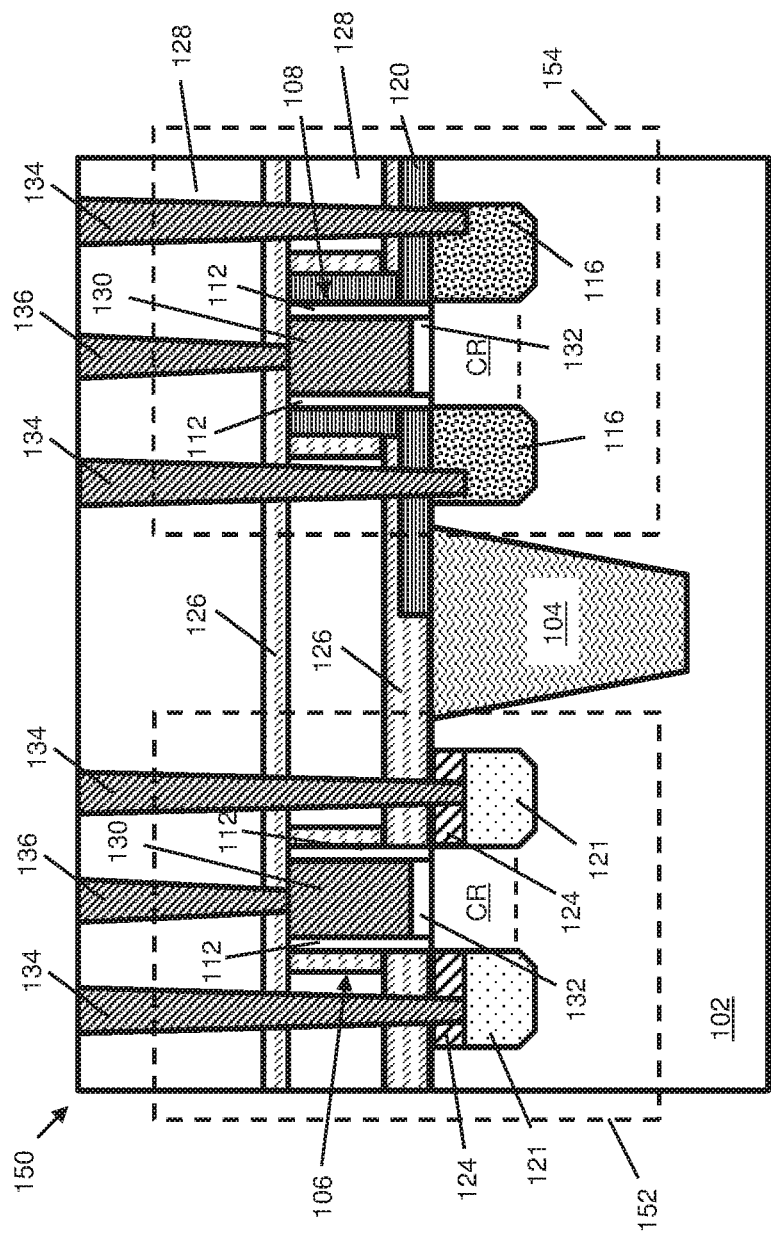
FIG. 10 provides a cross-sectional view of an IC structure with S/D contacts to the niobium-based silicide layer according to embodiments of the disclosure.

Referring to FIG. 10, further processing of the materials discussed herein may include, e.g., forming an additional portion of insulative liner 126 on ILD 128 and gate structures 106, 108, and thereafter forming an additional portion of ILD 128 to vertically separate gate structures 106, 108 from metal wires formed thereon. Thereafter, a set of openings (not shown) may be formed within ILD 128 and filled with conductive materials to form S/D contacts 134. S/D contact(s) 134 may be formed such that at least a portion of S/D contact(s) 134 are in contact with niobium-based silicide layer(s) 124. For example, S/D contact(s) 134 may extend at least partially through niobium-based silicide layer(s) 124 to have sidewalls in contact with the material composition of niobium-based silicide layer 124. In further examples, S/D contact(s) 134 may include a bottom surface at least partially in contact with niobium-based silicide layer 124. At other locations, S/D contacts 134 may be in contact with S/D region(s) 116, 121 in cases where niobium-based silicide layer(s) 124 have not been formed. S/D contact(s) 134 additionally may include, e.g., refractory metal liners (not shown) to horizontally separate conductive materials of contact(s) 134 from ILD 128 and/or other horizontally adjacent materials (not shown). Such liners may include materials such as but not limited to: tantalum nitride (TaN) and tantalum; tantalum nitride, tantalum and cobalt; and magnesium (Mn), or combinations thereof. In further processing, gate contacts 136 may also be formed to first gate structure 106 and/or second gate structure 108. Although S/D contacts 134 and gate contacts 136 are shown in FIG. 8 as being in the same cross-sectional plane, it is understood that gate contacts 136 will be located in a different horizontal plane in front of, or behind, the cross-section shown in FIG. 8 in many implementations.

Various methods according to the disclosure may yield an IC structure 150 including a first transistor 152 and a second transistor 154, one or more of which may include at least some of the structures or components described herein and their accompanying technical features. First transistor according to embodiments of the disclosure may include, e.g., S/D regions 121 with niobium-based silicide layer 124 on at least the upper surface of S/D region 121, such that niobium-based silicide layer 124 extends across substantially an entire width of S/D region 121. In an example, niobium-based silicide layer 124 may include, e.g., TiNb, S/D region 121 may include SiP, and S/D region 116 may include SiGe as noted elsewhere herein. First gate structure 106 may be on substrate 102 adjacent S/D region 121.

In IC structure 150, isolation layer 104 may be on substrate 102 adjacent first transistor 152 to horizontally separate first transistor 152 from second transistor 154. Second transistor 154 may include S/D region 116 but may not include niobium-based silicide layer 124 thereon. Thus, second transistor 154 may be free of any niobium-based materials and thus may be physically distinguishable from first transistor 152. One S/D contact 134 may be in contact with niobium-based silicide layer 124 of first transistor 152, while another S/D contact 134 may be in contact with S/D region 116 of second transistor 154. Each transistor 152, 154 may take the form of a FET in an example, though transistor(s) 152, 154 alternatively may be in the form of any conceivable transistor configuration. Where transistor(s) 152, 154 are in the form of a FET, S/D regions 116, 121 may be at least partially embedded within substrate 102.

Various insulative materials of IC structure 150 and/or transistors 152, 154 may include, e.g., insulative liner 126 on at least a portion of the upper surface of niobium-based silicide layer 124, and in contact with sidewalls of first gate structure 106 and S/D contact(s) 134. In the case of second transistor 154, additional spacer 120 may be formed at least partially on an upper surface of S/D region(s) 116 such that at least a portion of additional spacer 120 is vertically between S/D region(s) 116 and insulative liner 126. First transistor 152 by contrast may be free of additional spacer 120 material thereon. However embodied, first transistor 152 and second transistor 154 of IC structure 150 may feature complementary (i.e., opposite) doping as discussed herein. In an example, first transistor 152 may be an N-type transistor (e.g., an "nFET") while second transistor 154 may be a P-type transistor (e.g., a "pFET").

Various embodiments of the disclosure may provide technical and commercial advantages, some of which are described by example herein. The forming of niobium-based silicide layer 124 may provide various mechanical benefits to IC structure 150, e.g., increasing the available surface area for conductive contacts to be formed on silicide material when forming source and drain terminals for a transistor. Niobium-based silicide layer 124 being formed on an entire horizontal width of S/D regions 121 may also provide mechanical benefits, e.g., additional tensile stress being induced within first transistor 152. Additionally, the presence of niobium-based silicide layer 124 may cover S/D regions 121 of only first transistor 152, thereby allowing additional or alternative materials to be formed on second transistor 154. Such materials may include, e.g., additional spacer 120. Additional spacer 120 being formed selectively on second transistor 154 may protect its S/D regions 116 from having niobium-based silicide layer 124 being formed thereon, and may provide additional electrical insulation for second transistor 154.

The descriptions of the various embodiments of the present invention have been presented for purposes of illustration, but are not intended to be exhaustive or limited to the embodiments disclosed. Many modifications and variations will be apparent to those of ordinary skill a in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) structure, comprising:
a transistor on a substrate, the transistor including a gate structure above the substrate and a source/drain (S/D) region on the substrate adjacent the gate structure;
a niobium-based silicide layer on at least an upper surface the S/D region of the transistor, wherein the niobium-based silicide layer extends across substantially an entire width of the S/D region;
an S/D contact to the S/D region and in contact with the niobium-based silicide layer, wherein a bottom surface of the S/D contact is in contact with the S/D region and wherein a sidewall of the S/D contact is in contact with the niobium-based silicide layer; and
an insulative liner on an upper surface of the niobium-based silicide layer and an upper surface of the gate structure, and in contact with each of a sidewall of the gate structure and the sidewall of the S/D contact.

2. The IC structure of claim 1, wherein the niobium-based silicide layer includes a titanium niobide (TiNb) silicide material.

3. The IC structure of claim 1, wherein the S/D region includes silicon phosphide (SiP).

4. The IC structure of claim 1, wherein the transistor includes a field effect transistor (FET), and wherein the S/D region is at least partially embedded within the substrate.

5. The IC structure of claim 1, further comprising:
an isolation layer on the substrate adjacent the transistor; and
an additional transistor on the substrate adjacent the isolation layer, wherein the isolation layer is between the transistor and the additional transistor, and wherein the additional transistor is free of niobium-based silicide material.

6. The IC structure of claim 5, wherein the substrate below the transistor includes a first doping type, and wherein the substrate below the additional transistor includes a second doping type opposite the first doping type.

7. An integrated circuit (IC) structure, comprising:
a first transistor on a substrate, the first transistor including a first gate structure above the substrate and a first source/drain (S/D) region on the substrate adjacent the first gate structure;
a niobium-based silicide layer on at least an upper surface the first S/D region of the first transistor, wherein the niobium-based silicide layer extends across substantially an entire width of the first S/D region;
an isolation layer on the substrate adjacent the first transistor;
an second transistor on the substrate adjacent the isolation layer, the second transistor including a second gate structure above the substrate and a second source/drain (S/D) region on the substrate adjacent the second gate structure, wherein the isolation layer is between the first transistor and the second transistor, and wherein the second S/D region is free of niobium-based silicide material thereon;
a first S/D contact to the first S/D region in contact with the niobium-based silicide layer, wherein a bottom surface of the first S/D contact is in contact with the first S/D region and wherein a sidewall of the first S/D contact is in contact with the niobium-based silicide layer;
a second S/D contact to the second S/D region in contact with the second S/D region; and
an insulative liner on an upper surface of the niobium-based silicide layer, an upper surface of the first gate structure, an upper surface of the second gate structure, and in contact with each of a sidewall of the first gate structure, a sidewall of the second gate structure, and the sidewall of the first S/D contact.

8. The IC structure of claim 7, wherein the niobium-based silicide layer includes a titanium niobide (TiNb) silicide material.

9. The IC structure of claim 7, wherein the first S/D region includes silicon phosphide (SiP), and wherein the second S/D region includes silicon germanium (SiGe).

10. The IC structure of claim 7, wherein the first transistor and the second transistor each include a field effect transistor (FET), and wherein the first S/D region and the second S/D region are at least partially embedded within the substrate.

11. The IC structure of claim 7, further comprising a spacer on an upper surface of the second S/D region and in contact with a sidewall of the second gate structure, wherein at least a portion of the spacer is vertically between the second S/D region and the insulative liner.

12. The IC structure of claim 7, wherein the substrate below the first transistor includes a first doping type, and wherein the substrate below the second transistor includes a second doping type opposite the first doping type.

* * * * *